US009395629B2

(12) United States Patent
Tsai (10) Patent No.: US 9,395,629 B2
(45) Date of Patent: Jul. 19, 2016

(54) SPECIAL LAYOUT DESIGN PRINTED RECTANGULAR PATTERN AND IMPROVED PATTERN CRITICAL DIMENSION UNIFORMITY (71) Applicant: MACRONIX INTERNATIONAL CO., LTD., Hsinchu (TW)

(72) Inventor: Feng-Nien Tsai, New Taipei (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 96 days.

(21) Appl. No.: 14/184,693

(22) Filed: Feb. 19, 2014

(65) Prior Publication Data
US 2015/0234283 A1 Aug. 20, 2015

(51) Int. Cl.
G03F 7/26 (2006.01)
G03F 7/20 (2006.01)
G03F 1/68 (2012.01)
H01L 21/027 (2006.01)

(52) U.S. Cl.
CPC .............. G03F 7/2045 (2013.01); G03F 1/68 (2013.01); H01L 21/0274 (2013.01)

(58) Field of Classification Search
CPC ........................................................ G03F 7/26
See application file for complete search history.

(56) References Cited

U.S. PATENT DOCUMENTS

2006/0019202 A1\* 1/2006 Houston ................... G03F 1/36
430/313
2010/0058281 A1\* 3/2010 Fujimura ............... B82Y 10/00
716/55

\* cited by examiner

Primary Examiner — Kathleen Duda
(74) Attorney, Agent, or Firm — Baker & McKenzie LLP (57) ABSTRACT Present example embodiments relate generally to semiconductor devices, masks, wafers, and methods of fabricating semiconductor devices, masks, and wafers. Example methods comprise providing a substrate having a photoresist layer. Example methods further comprise providing a mask having a substantially rectangular pattern and an elongated pattern, at least a portion of the elongated pattern positioned at least proximate to a corner of the substantially rectangular pattern, wherein the elongated pattern extends outwardly from the substantially rectangular pattern. Example methods further comprise forming a substantially rectangular shaped pattern on the photoresist layer resembling the substantially rectangular pattern using a cooperation of the substantially rectangular pattern and the elongated pattern.

26 Claims, 8 Drawing Sheets

SPECIAL LAYOUT DESIGN PRINTED RECTANGULAR PATTERN AND IMPROVED PATTERN CRITICAL DIMENSION UNIFORMITY

TECHNICAL FIELD

The present disclosure relates generally to semiconductor devices, masks, and methods of fabricating semiconductor devices and masks.

BACKGROUND

Semiconductor devices, such as memory devices, are fabricated by performing a photolithography process, wherein a mask is subjected to an exposure to light and a series of patterns are formed on portions of a photoresist layer exposed to the light. The series of patterns formed on the photoresist layer, along with any underlying layers between the photoresist layer and its substrate, are then etched to form layers of the semiconductor device.

In the continuously evolving semiconductor device field, semiconductor device manufacturers generally compete to bring to market semiconductor devices, such as memory devices, having both greater storage capacity and smaller physical size. Present methods attempt to achieve one or more of these goals by making dimensionally smaller each of the patterns in the series of patterns on the mask and in the respective series of patterns formed on the photoresist layer. Alternatively or in addition, attempts include forming each of the patterns in the series of patterns on the mask and in the respective series of patterns formed on the photoresist layer to be closer to one another so as to increase the density of patterns formed on the semiconductor device.

SUMMARY

Despite recent advances in increasing storage capacity and shrinking physical size, it is recognized herein that conventional methods suffer from several problems, including, but not limited to, poor or low critical dimension uniformity (CDU), poor or low depth of focus (DoF), unreliability of proper and/or accurate pattern formation on the photoresist layer, high occurrence of blind patterns (or holes), undesirable corner rounding effects on patterns formed on the photoresist layer, and/or insufficient size of the patterns formed on the photoresist layer.

Present example embodiments relate generally to improved semiconductor devices and masks, and improved methods of fabricating semiconductor devices and masks.

In an exemplary embodiment, a method of fabricating a semiconductor device is described, the method comprising providing a substrate having a photoresist layer. The method further comprises providing a photoresist mask (or "photomask" or "mask") having a substantially rectangular pattern and elongated patterns, at least a portion of the elongated pattern positioned at least proximate to a corner of the substantially rectangular pattern, wherein the elongated pattern extends outwardly from the substantially rectangular pattern. The method further comprises forming a substantially rectangular shaped pattern on the photoresist layer resembling the substantially rectangular pattern of the mask using a cooperation of light exposure through the substantially rectangular pattern and the elongated pattern of the mask.

In another exemplary embodiment, a method of fabricating a semiconductor device is described comprising providing a substrate having a photoresist layer. The method further comprises providing a mask having a series of substantially rectangular patterns and a series of elongated patterns, each elongated pattern proximate or connected to and extending outwardly from one of a plurality of corners of each substantially rectangular pattern, wherein each substantially rectangular pattern comprises a first width and a first length, wherein each elongated pattern comprises a second width and a second length greater than the second width, wherein each substantially rectangular pattern is separated from an adjacent substantially rectangular pattern in the series by a separation distance, wherein the second length is greater than or equal to one quarter of the sum of the first width and the separation distance, and wherein the second width is less than or equal to 0.15 micrometers. It should be appreciated by one of ordinary skill in the art that reference to specific exemplary dimensions will be in accordance with the wavelengths of the patterning light for the photolithographic process. Other dimensions may flow from using a different wavelength photolithographic process, and such variations should be considered as being directly in accordance with the claim limitations or of being substantially equivalent thereto. The method further comprises forming a series of substantially rectangular shaped patterns on the photoresist layer resembling the series of substantially rectangular patterns of the mask, each substantially rectangular shaped pattern formed using a cooperation of light exposure through one substantially rectangular pattern and one or more elongated patterns of the mask.

In another exemplary embodiment, a method of fabricating a mask layout for use in forming a substantially rectangular shaped pattern on a photoresist layer of a substrate comprises providing a mask, forming a substantially rectangular pattern on the mask, and forming an elongated pattern on the mask, the elongated pattern proximate or connected to and extending outwardly from a corner of the substantially rectangular pattern on the mask. When a photoresist layer of a substrate is applied to an exposure process using the mask, the mask is operable to form a substantially rectangular shaped pattern on the photoresist layer by forming shaped patterns on the photoresist layer using light exposure through the substantially rectangular pattern of the mask and reducing a roundness of a corner of the shaped patterns using light exposure through the elongated pattern.

In another exemplary embodiment, a method of fabricating a mask layout for use in forming a series of substantially rectangular shaped patterns on a photoresist layer of a substrate comprises providing a mask, forming a series of substantially rectangular patterns separated by a separation distance on the mask, each substantially rectangular pattern having a first width and a first length, and forming a series of elongated patterns on the mask, each elongated pattern having a second width and a second length, each elongated pattern proximate or connected to and extending outwardly from one of a plurality of corners of each substantially rectangular pattern. In an example embodiment, the second length is greater than or equal to one quarter of the sum of the first width and the separation distance, and the second width is less than or equal to 0.15 micrometers. In an example embodiment, when a photoresist layer of a substrate is applied to an exposure process using the mask, the mask is operable to form a series of substantially rectangular shaped patterns on the photoresist layer resembling the series of substantially rectangular patterns of the mask by forming a series of shaped patterns on the photoresist layer using light exposure through the series of substantially rectangular patterns formed on the mask and reducing a roundness of one or more corners of the series of shaped patterns on the photoresist layer using light exposure through the series of elongated patterns formed on the mask.

In another exemplary embodiment, a mask for use in fabricating a semiconductor device comprises a substantially rectangular pattern and an elongated pattern, the elongated pattern proximate or connected to and extending outwardly from a corner of the substantially rectangular pattern. When a photoresist layer of a substrate is applied to an exposure process using the mask, the mask is operable to form a substantially rectangular shaped pattern on the photoresist layer resembling the substantially rectangular pattern of the mask by forming shaped patterns on the photoresist layer using light exposure through the substantially rectangular pattern of the mask and reducing a roundness of a corner of the shaped patterns using light exposure through the elongated pattern.

In another exemplary embodiment, a mask for use in fabricating a semiconductor device comprises a series of substantially rectangular patterns separated by a separation distance, each substantially rectangular pattern having a first width and a first length, and a series of elongated patterns, each elongated pattern having a second width and a second length, each elongated pattern proximate or connected to and extending outwardly from one of a plurality of corners of each substantially rectangular pattern. When a photoresist layer of a substrate is applied to an exposure process using the mask, the mask is operable to form a series of substantially rectangular shaped patterns on the photoresist layer resembling the series of substantially rectangular patterns of the mask by forming a series of shaped patterns on the photoresist layer using light exposure through the series of substantially rectangular patterns of the mask and reducing a roundness of one or more corners of the series of shaped patterns on the photoresist layer using light exposure through the series of elongated patterns.

In another exemplary embodiment, a semiconductor device formed by a mask comprises a substrate, a photoresist layer formed on the substrate, and a substantially rectangular shaped pattern formed on the photoresist layer, the substantially rectangular shaped pattern formed by applying an exposure process to the photoresist layer using light exposure through a substantially rectangular pattern on a mask to form shaped patterns on the photoresist layer, and applying light exposure through one or more elongated patterns on the mask to reduce a roundness of one or more corners of the shaped patterns, wherein the substantially rectangular shaped pattern on the photoresist layer resembles the substantially rectangular pattern on the mask.

In another exemplary embodiment, a semiconductor device formed by a mask comprises a substrate, a photoresist layer formed on the substrate, and a pattern formed on the photoresist layer. The pattern comprises two opposing first sides and two opposing second sides. Each of the first sides comprises a first end portion, a second end portion, and a mid portion. Furthermore, each of the first sides are formed in such a way that a distance between the first end portions of the two first sides is greater than a distance between the mid portions of the two first sides.

BRIEF DESCRIPTION OF THE DRAWINGS

For a more complete understanding of the present disclosure, example embodiments, and their advantages, reference is now made to the following description taken in conjunction with the accompanying drawings, in which like reference numbers indicate like features, and.

Although similar reference numbers may be used to refer to similar elements for convenience, it can be appreciated that each of the various example embodiments may be considered to be distinct variations.

DETAILED DESCRIPTION

Example embodiments will now be described hereinafter with reference to the accompanying drawings, which form a part hereof, and which illustrate example embodiments which may be practiced. As used in the disclosures and the appended claims, the terms "example embodiment," "exemplary embodiment," and "present embodiment" do not necessarily refer to a single embodiment, although they may, and various example embodiments may be readily combined and/or interchanged without departing from the scope or spirit of example embodiments. Furthermore, the terminology as used herein is for the purpose of describing example embodiments only and is not intended to be limitations. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

In general, a semiconductor device, such as a memory device, may be fabricated by first forming a desired pattern or series of patterns on a mask, forming a photoresist layer on a substrate, and applying a photolithography process to the mask and the photoresist layer. More specifically, the mask having the desired pattern or series of patterns is aligned above the substrate having the photoresist layer formed thereon and subjected to an exposure to light, such as UV light, e-beams, x-rays, and/or other wavelength light and/or radiation. A pattern or series of patterns is formed on those portions of the photoresist layer exposed to the light, that is, those portions corresponding to the pattern(s) on the mask. In a positive tone development process, the patterns formed on the photoresist layer are subsequently etched to form the semiconductor device, whereas in a negative tone development process, the portions surrounding the patterns formed on the photoresist layer are etched to form the semiconductor device.

It is recognized herein that semiconductor devices, such as memory devices, comprising both greater storage capacity and smaller physical size are desired in today's semiconductor industry. Such goals may be achieved by making dimensionally smaller each of the patterns in the series of patterns on the mask and respective photoresist layer. Alternatively or in addition, each of the patterns in the series of patterns on the mask and the photoresist layer may be formed closer to one another so as to increase the density of patterns formed on the semiconductor device.

Despite recent advances in increasing storage capacity and shrinking the physical size of semiconductor devices, it is recognized herein that conventional methods encounter, among other things, poor or low critical dimension uniformity (CDU), poor or low depth of focus (DoF), unreliability of proper and/or accurate pattern formation on the photoresist layer, high or often occurrences of blind patterns (or blind holes), undesirable corner rounding effects on patterns formed on the photoresist layer, and/or insufficient overall size/dimension of the patterns formed on the photoresist layer.

It is recognized herein that the above-described problems of conventional methods, semiconductor devices, masks, and wafers may be improved by example embodiments of an improved method of fabricating a semiconductor device, an improved method of fabricating a photomask, an improved photomask, and an improved semiconductor device.

Figure 1:
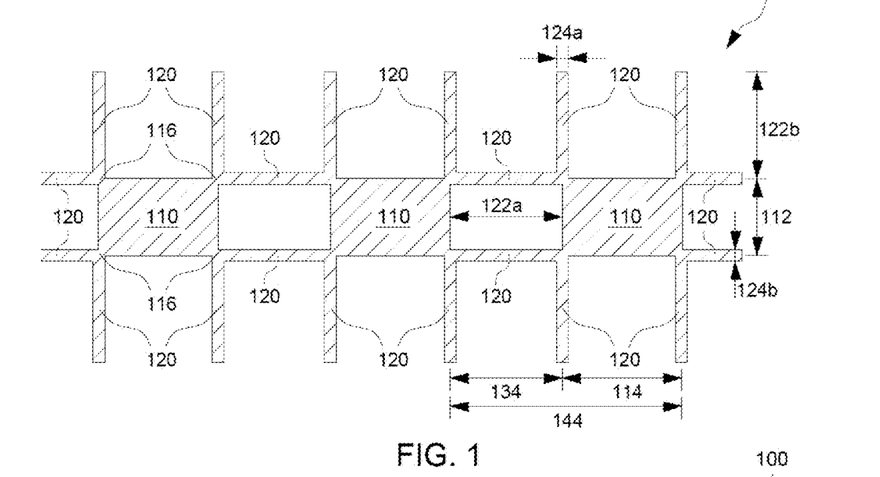
FIG. 1 is an illustration of an exemplary embodiment of a photomask having a series of rectangular patterns and a series of elongated patterns.

FIG. 1 illustrates a portion of an example embodiment of a photomask 100 for use in fabricating a semiconductor device. The photomask 100 comprises one or more patterns (or openings or holes) 110 and one or more elongated patterns (or openings or holes) 120 for each pattern 110. Although the patterns 110 are illustrated in the accompanying figures and described herein as being substantially rectangular, it is to be understood that example embodiments of the pattern 110 may be in the form of one or more other shapes, including a square, other polygons, and approximations thereof, that enable achieving the purposes and advantages described herein.

As shown in FIG. 1, the substantially rectangular pattern 110 comprises a length 112 and a width 114, and the elongated patterns 120 comprise lengths 122a and 122b and widths 124a and 124b, wherein the lengths 122a and 122b of the elongated patterns 120 are greater than the widths 124a and 124b of the elongated patterns 120. It is to be understood herein that the one or more elongated patterns 120 corresponding to each rectangular pattern 110 may or may not be of the same lengths 122a and 122b and widths 124a and 124b, so long as the widths 124a and 124b of each elongated pattern 120 are less than or equal to about 0.15 micrometers and the lengths 122a and 122b of each elongated pattern 120 are greater than or equal to about one quarter of the pitch 144. In example embodiments, the pitch 144 may be defined as the sum of the line 134 and space 114, wherein the line 134 may be defined as the distance between adjacent rectangular patterns 110 and the space 114 may be defined as the distance between adjacent sides of a rectangular pattern 110. In example embodiments, the lengths 122a and 122b of each elongated pattern 120 may be greater than or equal to about one third of the width 114 of a rectangular pattern 110. Furthermore, in example embodiments, the length 122a may be greater than, equal to, or lesser than the length 122b, and the width 124a may be greater than, equal to, or lesser than the width 124b.

Figure 2A:
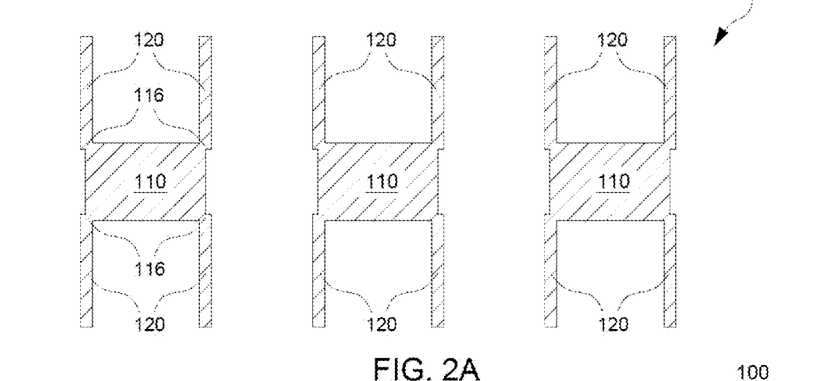
FIG. 2A is an illustration of an exemplary embodiment of a photomask having a series of rectangular patterns and an elongated pattern for each corner of each rectangular pattern.
Figure 2B:
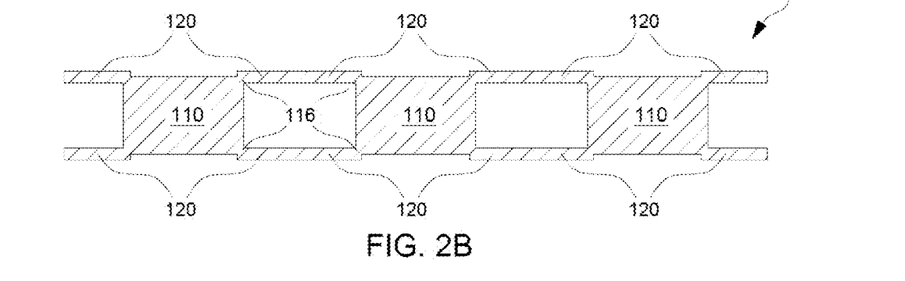
FIG. 2B is an illustration of another exemplary embodiment of a photomask having a series of rectangular patterns and an elongated pattern for each corner of each rectangular pattern.
Figure 2C:
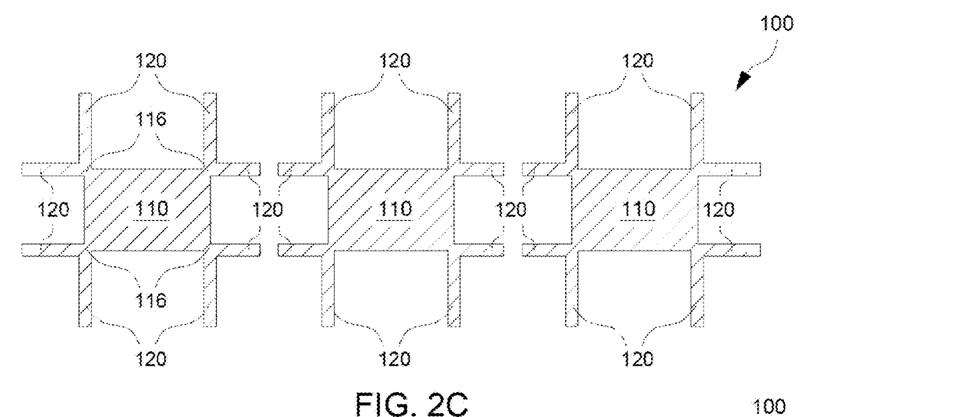
FIG. 2C is an illustration of an exemplary embodiment of a photomask having a series of rectangular patterns and more than one elongated pattern for each corner of each rectangular pattern.
Figure 2D:
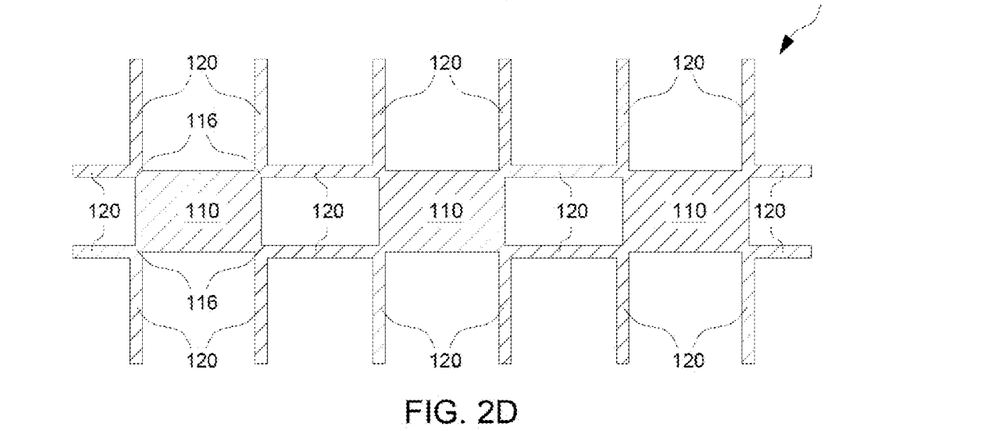
FIG. 2D is an illustration of another exemplary embodiment of a photomask having a series of rectangular patterns and more than one elongated pattern for each corner of each rectangular pattern.
Figure 2E:
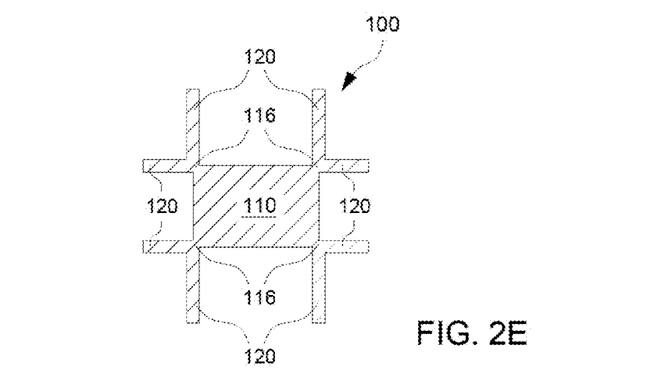
FIG. 2E is an illustration of an exemplary embodiment of a photomask having a rectangular pattern and more than one elongated pattern for each corner of the rectangular pattern.

As illustrated in FIGS. 2A, 2B, 2C, 2D, and 2E, an elongated pattern 120 on the photomask 100 may be in close proximity with, and/or connect to, and extend outwardly from a corner 116 of one corresponding rectangular pattern 110 (FIGS. 2A, 2C, and 2E) or more than one corresponding rectangular patterns 110 (FIGS. 2B and 2D) on the photomask 100. Each corner 116 of the rectangular pattern 110 may be in close proximity with and/or connect to only one elongated pattern 120 (FIGS. 2A and 2B) or more than one corresponding rectangular patterns 110 (FIGS. 2C, 2D, and 2E). It is recognized herein that, although elongated patterns 120 in close proximity with and/or connecting to one corner 116 of the rectangular pattern 110 (FIGS. 2C, 2D, and 2E) are illustrated as being orthogonal to each other, such elongated patterns 120 in close proximity with and/or connecting to one corner 116 of the rectangular pattern 110 may be oriented in other ways relative to one another in example embodiments. It is further recognized herein that orthogonal elongated patterns 120 may provide for simplicity and efficiency in the fabrication process.

Figure 3A:
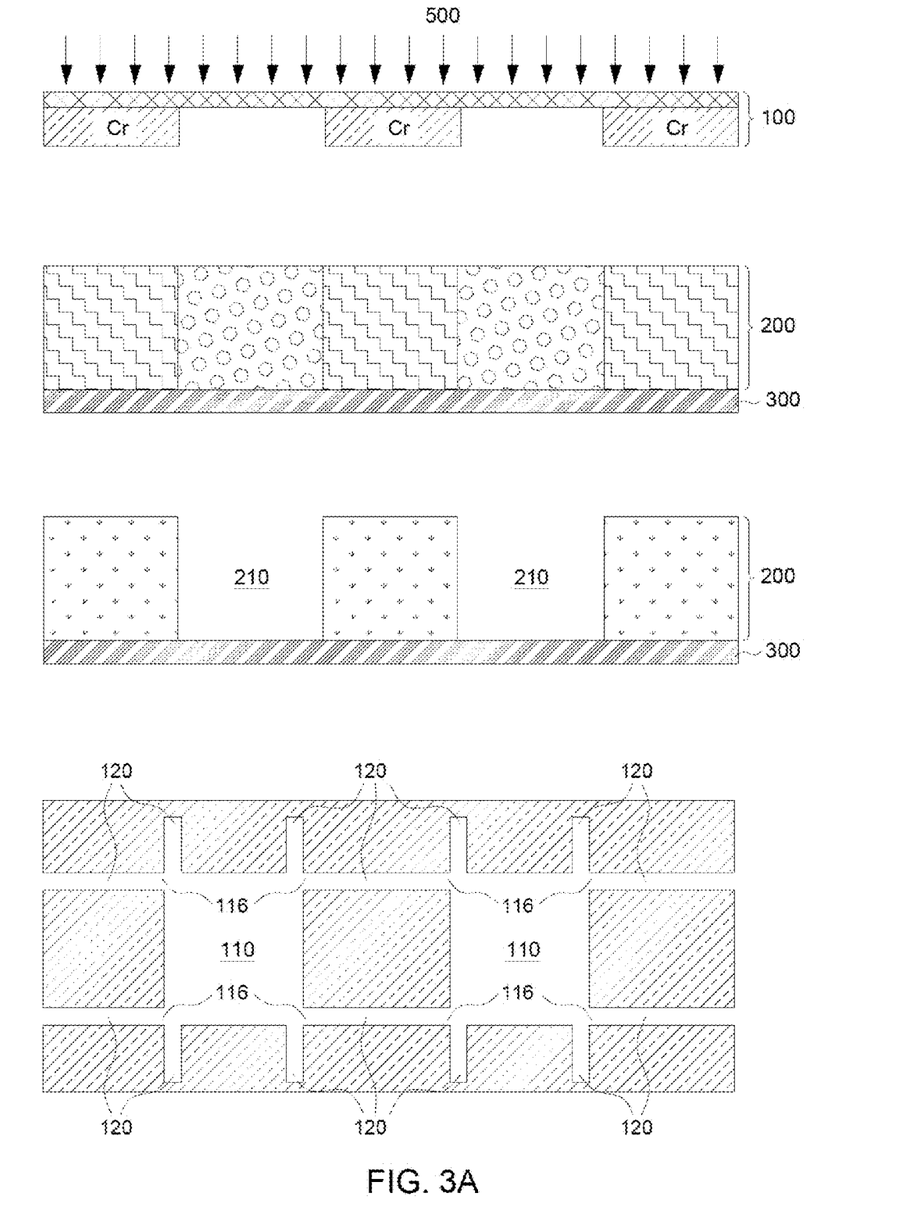
FIG. 3A is an illustration of an exemplary embodiment of fabricating a semiconductor device using positive tone development.
Figure 3B:
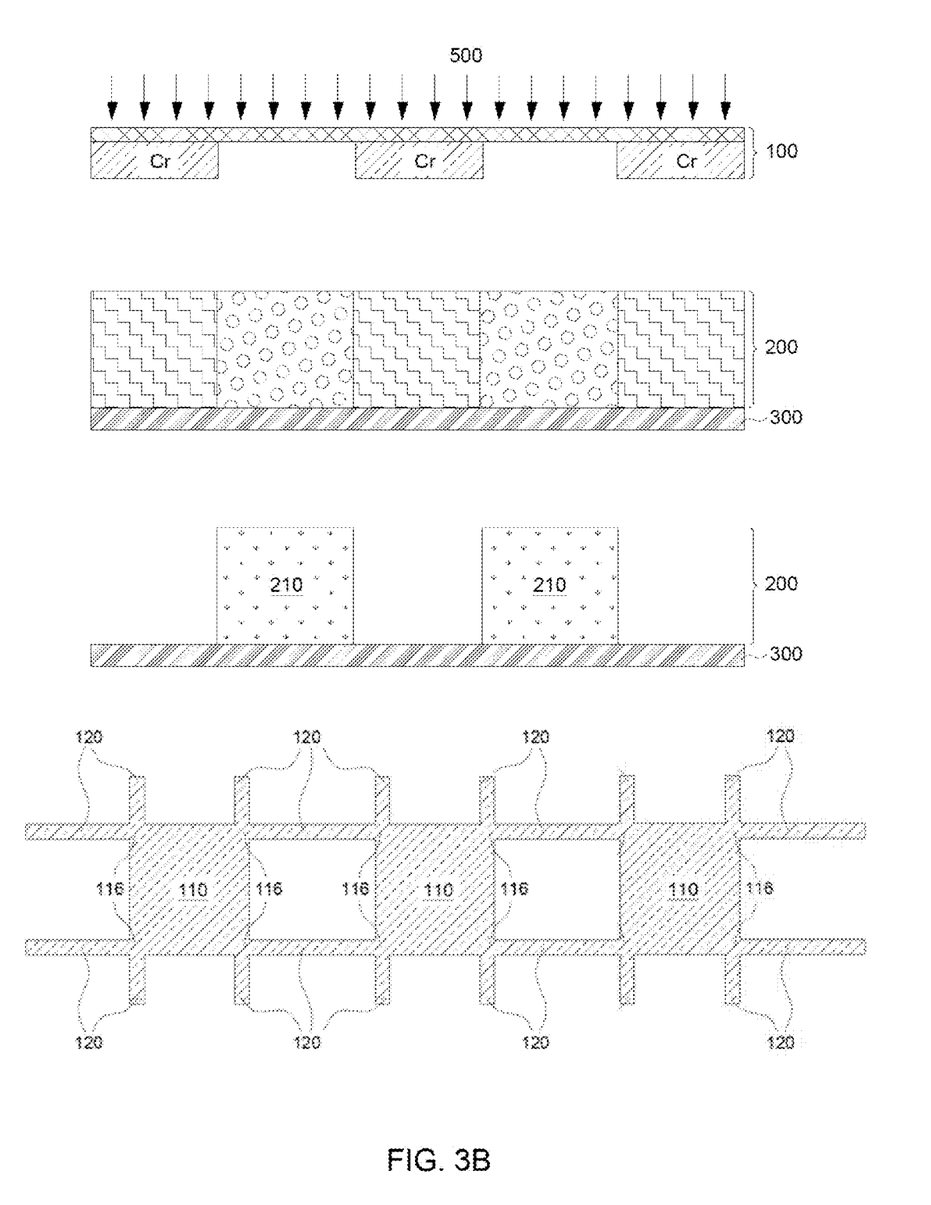
FIG. 3B is an illustration of an exemplary embodiment of fabricating a semiconductor device using negative tone development.
Figure 4A:
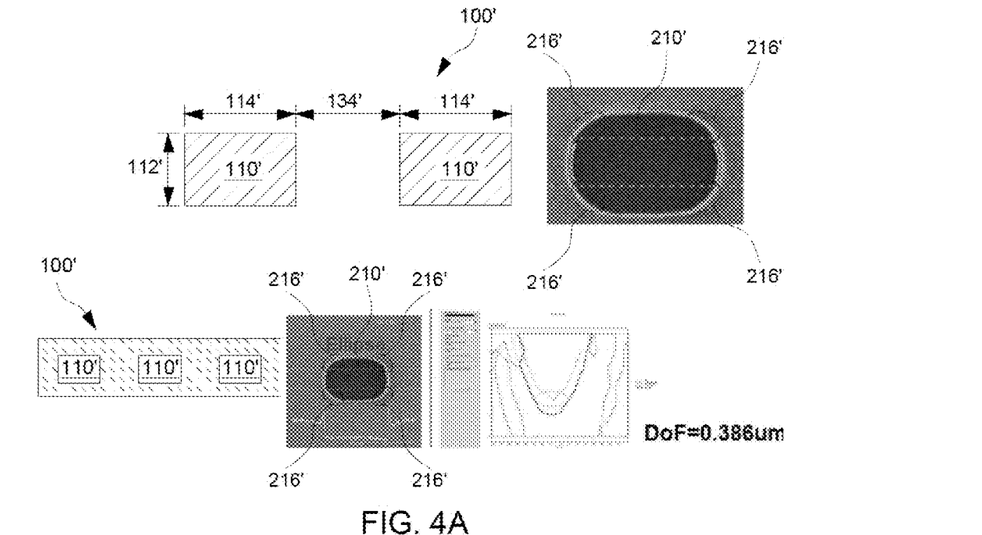
FIG. 4A is an illustration of a comparative example of a mask and a pattern formed using the mask.
Figure 4B:
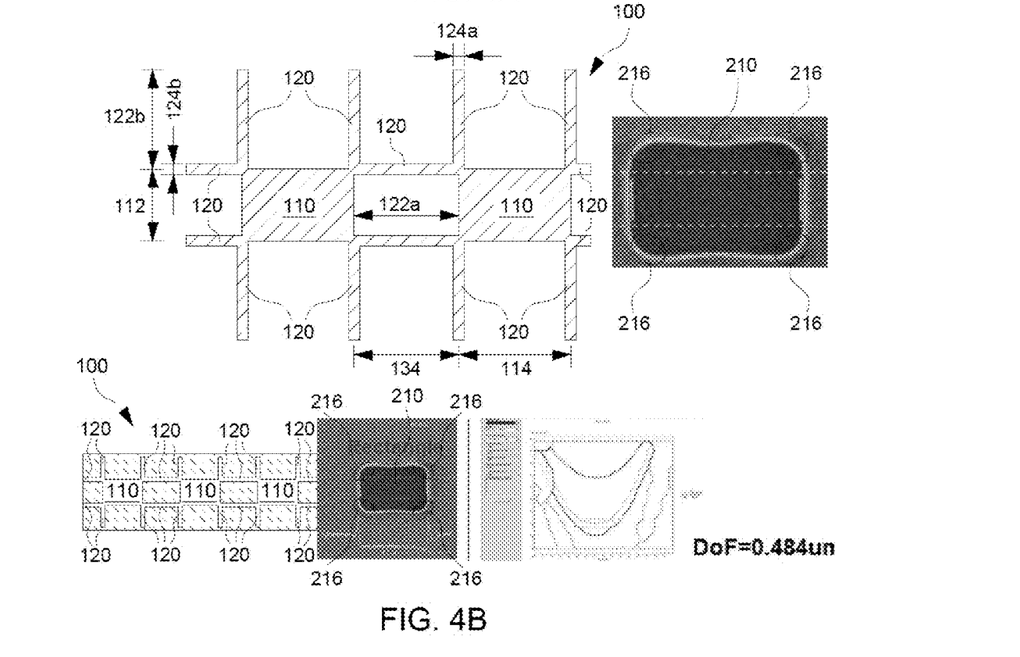
FIG. 4B is an illustration of an example embodiment of a mask and a substantially rectangular shaped pattern formed using an example embodiment of the mask.
Figure 5A:
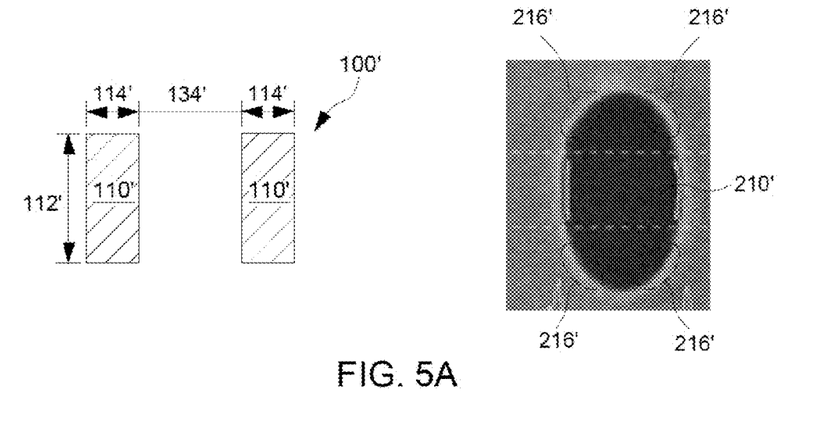
FIG. 5A is an illustration of another comparative example of a mask and a pattern formed using the mask.
Figure 5B:
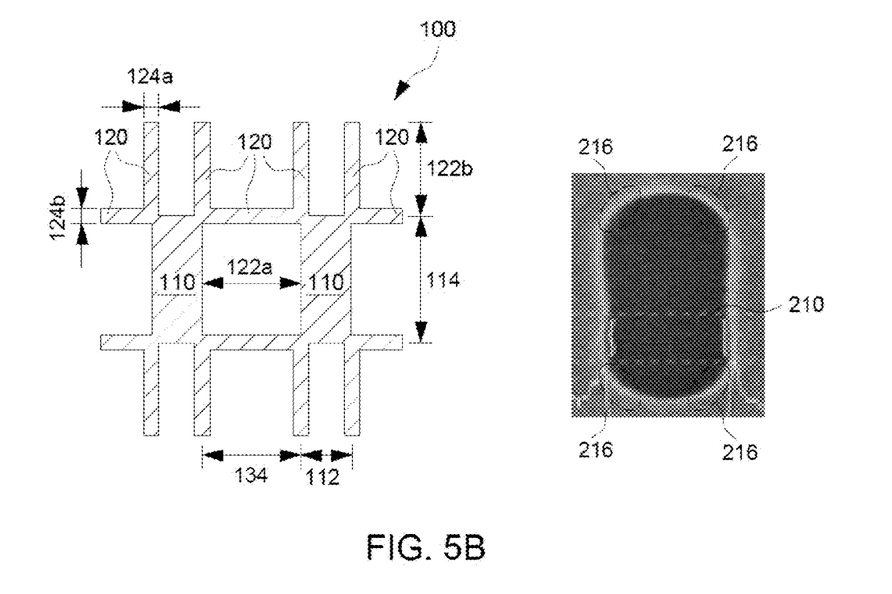
FIG. 5B is an illustration of another example embodiment of a mask and a substantially rectangular shaped pattern formed using an example embodiment of the mask.
Figure 6A:
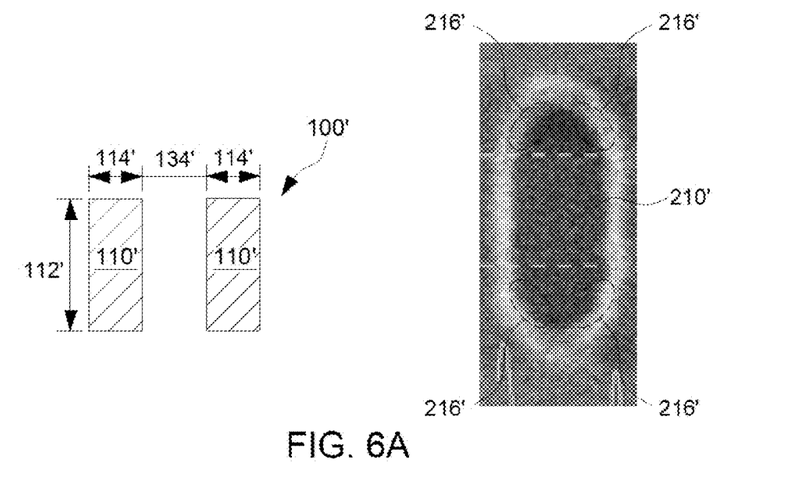
FIG. 6A is an illustration of another comparative example of a mask and a pattern formed using the mask.
Figure 6B:
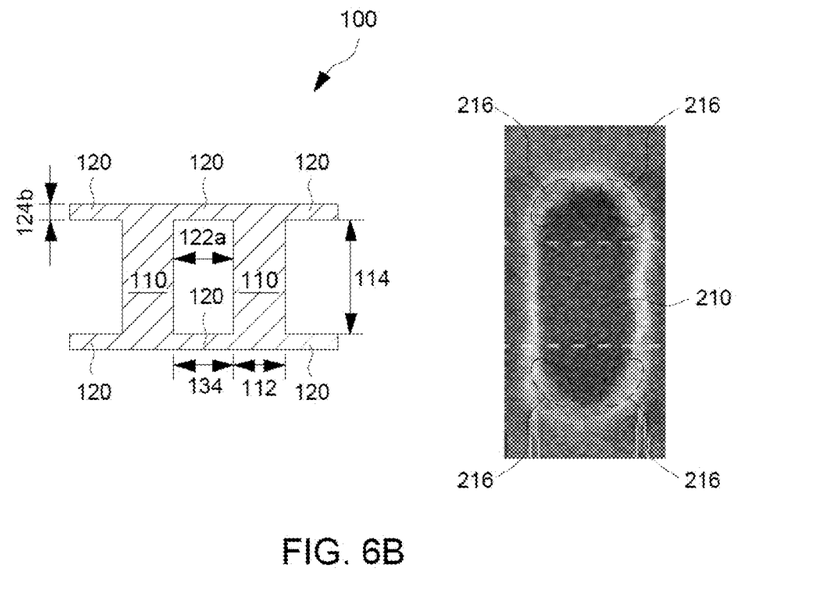
FIG. 6B is an illustration of another example embodiment of a mask and a substantially rectangular shaped pattern formed using an example embodiment of the mask.

In fabricating a semiconductor device 100 (see FIGS. 3A and 3B), when a photoresist layer 200 of a substrate 300 is applied to an exposure process, such as by applying light 500 (UV light, e-beam, x-rays, etc.), using example embodiments of the photomask 100, the photomask 100 is operable to form substantially rectangular shaped patterns 210 on the photoresist layer 200 that resemble the rectangular patterns 110 on the photomask 100. In example embodiments, the photomask 100 is operable to form patterns on the photoresist layer 200, as illustrated in FIGS. 4B, 5B, and 6B, having two opposing first sides and two opposing second sides. In this regard, each of the first sides may comprise a first end portion, a second end portion, and a mid portion, and each of the second sides may comprise a third end portion, a fourth end portion, and a second mid portion. Furthermore, each of the first sides may be formed in such a way that a distance between the first end portions of the two first sides is greater than a distance between the mid portions of the two first sides. Furthermore, each of the first sides may be formed in such a way that a distance between the second end portions of the two first sides is greater than a distance between the mid portions of the two first sides. Furthermore, the distance between the first end portions of the two first sides may be substantially the same as the distance between the second end portions of the two first sides. Regarding the two second sides, each of the second sides may be formed in such a way that a distance between the third end portions of the two second sides is greater than a distance between the second mid portions of the two second sides. Furthermore, each of the second sides may be formed in such a way that a distance between the fourth end portions of the two second sides is greater than a distance between the second mid portions of the two second sides. Furthermore, the distance between the third end portions of the two second sides may be substantially the same as the distance between the fourth end portions of the two second sides. In example embodiments, either of the two first sides or the two second sides may be substantially parallel to one another. It is to be understood in the present disclosure that the term "substantially rectangular shaped pattern," or the like, may also include the aforementioned shapes, including shapes similar to or substantially the same as those illustrated in FIGS. 4B, 5B, and 6B, without departing from the teachings of the present disclosure. It is recognized herein that the substantially rectangular shaped patterns 210 formed on the photoresist layer 200 will enable the semiconductor device to achieve, among other things, reduced corner rounding effects, increased DoF, increased CDU, increased contact area on bottom layer, and reduced probability of blind patterns (or blind holes).

The forming of the substantially rectangular shaped patterns 210 may be better understood by explaining how the rectangular patterns 110 on the photomask 100 and the elongated patterns 120 on the photomask 100 cooperate together to form the substantially rectangular shaped patterns 210. Conceptually, light exposure through each rectangular pattern 110 on the photomask 100 is operable to form a shaped pattern on the photoresist layer 200, wherein the shaped pattern may comprise undesired corner rounding effects. Light exposure through the one or more elongated patterns 120 in close proximity with and/or connecting to each corner 116 of the rectangular pattern 110 on the photomask 100 operates to cooperate with light exposure through at least the corners 116 of the rectangular pattern 110 on the photomask 100 to form the substantially rectangular shaped pattern 210 on the photoresist layer 200. It is recognized herein that the substantially rectangular shaped pattern 210 on the photoresist layer 200 has reduced roundness of the corner areas 216 as compared to the shaped pattern formed by just the rectangular pattern 110 on the photomask 100.

After forming the substantially rectangular shaped patterns 210 on the photoresist layer 200, any post-development process of etching the photoresist layer 200 may be performed. For example, in positive tone development processes (FIG. 3A), portions 210 of the photoresist layer 200 (and any underlying layers between the photoresist layer 200 and the substrate 300, such as an oxide layer (not shown)) corresponding to the substantially rectangular shaped patterns 210 may be etched (removed), resulting in a patterned wafer for use as and/or in a semiconductor device. For negative tone development processes (FIG. 3B), portions 210 of the photoresist layer 200 (and any underlying layers between the photoresist layer 200 and the substrate 300, such as an oxide layer (not shown)) surrounding the substantially rectangular shaped patterns 210 may be etched (removed), resulting in a patterned wafer for use as and/or in a semiconductor device.

An explanation of example embodiments will now be provided by way of comparing example embodiments (see Examples 1, 2, and 3 below) and comparative examples (see Comparative Examples 1, 2, and 3 below).

Comparative Example 1

Photomask 100' of Comparative Example 1 comprising rectangular patterns 110' was aligned above a substrate having a photoresist layer. Each rectangular pattern 110' comprised a length 112' of about 0.4 microns and a width 114' of about 0.62 microns, and adjacent rectangular patterns 110' were separated by a separation distance 134' of about 0.58 microns. The photomask 100' of Comparative Example 1 was then subjected to an exposure of light to form a series of patterns 210' on the photoresist layer. As shown in FIG. 4A, the resultant patterns (or holes) 210' formable on the photoresist layer using the photomask 100' of Comparative Example 1 resembled more of an ellipse-shaped pattern 210' than a rectangular shaped pattern. Furthermore, the DoF of Comparative Example 1 was about 0.386 microns, and the resultant patterns 210' comprised undesirable rounded corners 216' and a relatively high occurrence of blind patterns (or blind holes).

Example 1

The photomask of Comparative Example 1 comprising rectangular patterns 110 was further provided with elongated patterns 120, and aligned above a substrate having a photoresist layer. Each rectangular pattern 110 comprised the same length 112 of about 0.4 microns and width 114 of about 0.62 microns as in Comparative Example 1, and adjacent rectangular patterns 110 were separated by the same separation distance 134 of about 0.58 microns as in Comparative Example 1. The elongated patterns 120 comprised widths 124a and 124b of about 0.06 microns and lengths 122a and 122b of about 0.58 microns. The photomask 100 of Example 1 was then subjected to the same exposure of light as in Comparative Example 1, and a series of patterns 210 was formed on the photoresist layer resembling the patterns on the photomask. As shown in FIG. 4B, the resultant patterns (or holes) 210 formable on the photoresist layer using the photomask 100 of Example 1 resembled more of a rectangular shaped pattern 210 than Comparative Example 1. Furthermore, the DoF of Example 1 was about 0.484 microns, which was substantially greater than that of Comparative Example 1, and the resultant patterns 210 comprised significantly reduced rounding of corners 216 and occurrence of blind patterns (or blind holes) than Comparative Example 1.

Comparative Example 2

Photomask of Comparative Example 2 comprising rectangular patterns 110' was aligned above a substrate having a photoresist layer. Each rectangular pattern 110' comprised a length 112' of about 0.5 microns and a width 114' of about 0.2 microns, and adjacent rectangular patterns 110' were separated by a separation distance 134' of about 0.4 microns. The photomask 100' of Comparative Example 2 was then subjected to an exposure of light to form a series of patterns 210' on the photoresist layer. As shown in FIG. 5A, the resultant patterns (or holes) 210' formable on the photoresist layer using the photomask 100' of Comparative Example 2 resembled more of an ellipse-shaped pattern 210' than a rectangular shaped pattern. Furthermore, the resultant patterns 210' comprised undesirable rounded corners 216' and a relatively high occurrence of blind patterns (or blind holes).

Example 2

The photomask of Comparative Example 2 comprising rectangular patterns 110 was further provided with elongated patterns 120, and aligned above a substrate having a photoresist layer. Each rectangular pattern 110 comprised the same length 112 of about 0.5 microns and width 114 of about 0.2 microns as in Comparative Example 2, and adjacent rectangular patterns 110 were separated by the same separation distance 134 of about 0.4 microns as in Comparative Example 2. The elongated patterns 120 comprised widths 124a and 124b of about 0.06 microns and lengths 122a and 122b of about 0.4 microns. The photomask 100 of Example 2 was then subjected to the same exposure of light as in Comparative Example 2, and a series of patterns 210 was formed on the photoresist layer resembling the patterns 110 on the photomask 100. As shown in FIG. 5B, the resultant patterns (or holes) 210 formable on the photoresist layer using the photomask 100 of Example 2 resembled more of a rectangular shaped pattern 210 than Comparative Example 2. Furthermore, the DoF of Example 2 was substantially greater than that of Comparative Example 2, and the resultant patterns 210 comprised significantly reduced rounding of corners 216 and occurrence of blind patterns (or blind holes) than Comparative Example 2.

Comparative Example 3

Photomask of Comparative Example 3 comprising rectangular patterns 110' was aligned above a substrate having a photoresist layer. Each rectangular pattern 110' comprised a length 112' of about 190 nm and a width 114' of about 85 nm, and adjacent rectangular patterns 110' were separated by a separation distance 134' of about 45 nm. The photomask 100' of Comparative Example 3 was then subjected to an exposure of light to form a series of patterns 210' on the photoresist layer. As shown in FIG. 6A, the resultant patterns (or holes) 210' formable on the photoresist layer using the photomask 100' of Comparative Example 3 resembled more of an ellipse-shaped pattern 210' than a rectangular shaped pattern. Furthermore, the resultant patterns 210' comprised undesirable rounded corners 216' and a relatively high occurrence of blind patterns (or blind holes). Furthermore, a measurement of the critical dimension uniformity (CDU) on the mask layout was 2.4 nm and 5.7 nm, and a measurement of the CDU for the wafer (PR) was 3.7 nm and 9.3 nm.

Example 3

The photomask of Comparative Example 3 comprising rectangular patterns 110 was further provided with elongated patterns 120, and aligned above a substrate having a photoresist layer. Each rectangular pattern 110 comprised the same length 112 of about 190 nm and width 114 of about 85 nm as in Comparative Example 3, and adjacent rectangular patterns 110 were separated by the same separation distance 134 of about 130 nm as in Comparative Example 3. The elongated patterns 120 comprised widths 124a and 124b of about 30 nm and lengths 122a and 122b of about 45 nm. The photomask 100 of Example 3 was then subjected to the same exposure of light as in Comparative Example 3, and a series of patterns 210 was formed on the photoresist layer resembling the patterns 110 on the photomask 100. As shown in FIG. 6B, the resultant patterns (or holes) 210 formable on the photoresist layer using the photomask 100 of Example 3 resembled more of a rectangular shaped pattern 210 than Comparative Example 3. Furthermore, the DoF of Example 3 was substantially greater than that of Comparative Example 3, and the resultant patterns 210 comprised significantly reduced rounding of corners 216 and occurrence of blind patterns (or blind holes) than Comparative Example 3. Furthermore, the CDU was significantly improved as compared to Comparative Example 3, as illustrated by the measured CDU on the mask of 2.4 nm and 4.8 nm, and the measured CDU on the wafer (PR) of 3.6 nm and 5.8 nm.

An explanation of an example embodiment of an exposure process will now be provided by way of comparing example embodiments.

Example 4

Figure 7A:
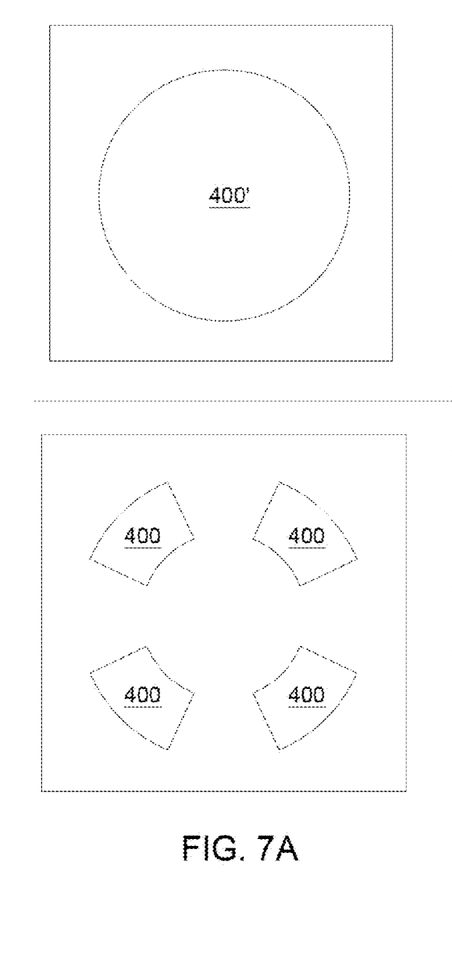
FIG. 7A is an illustration of an example embodiment of a mask and a substantially rectangular shaped pattern formed using an example embodiment of the mask and using a conventional mode exposure of light.

The photomask 100 of Example 1 comprising the same rectangular patterns 110 and elongated patterns 120 was aligned above a substrate 300 having a photoresist layer 200 in the same manner as in Example 1. The photomask 100 was then subjected to a conventional mode exposure of light 400', as illustrated in FIG. 7A, and a series of patterns 210 was formed on the photoresist layer 200 resembling the patterns 110 on the photomask 100. As in Example 1, Example 4 resembled more of a rectangular shaped pattern 210 than Comparative Example 1. Furthermore, the DoF of Example 4 was substantially greater than that of Comparative Example 1, and the resultant patterns 210 comprised significantly reduced rounding of corners 216 and occurrence of blind patterns (or blind holes) than Comparative Example 1.

Example 5

Figure 7B:
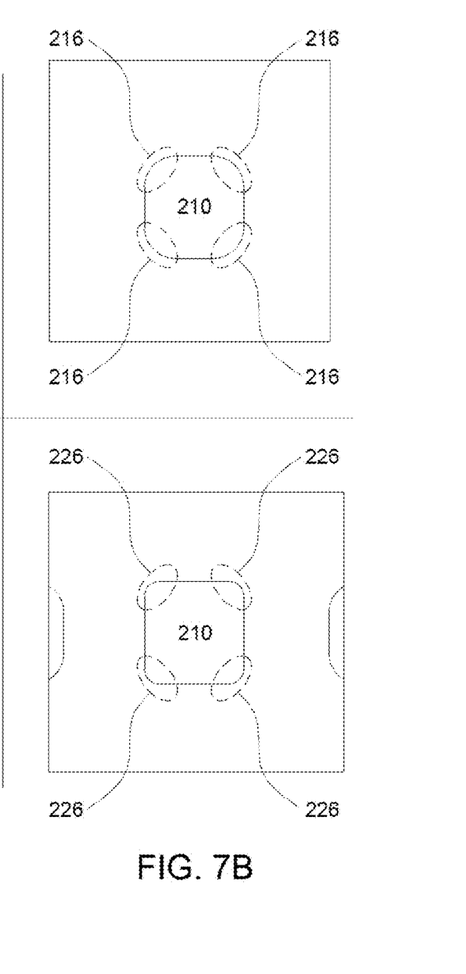
FIG. 7B is an illustration of an example embodiment of a mask and a substantially rectangular shaped pattern formed using an example embodiment of the mask and using a quasar mode exposure of light.

The photomask 100 of Example 1 comprising the same rectangular patterns 110 and elongated patterns 120 was aligned above a substrate 300 having a photoresist layer 200 in the same manner as in Example 1. The photomask 100 was then subjected to a different exposure of light (quasar mode) 400, as illustrated in FIG. 7B, and a series of patterns 210 was formed on the photoresist layer 200 resembling the patterns 110 on the photomask 100. It was observed that Example 5 resembled more of a rectangular shaped pattern 210 than Example 4. Furthermore, the DoF of Example 5 was greater than that of Example 4, and the resultant patterns comprised more reduced rounding of corners 226 than Example 4.

While various embodiments in accordance with the disclosed principles have been described above, it should be understood that they have been presented by way of example only, and are not limiting. Thus, the breadth and scope of the example embodiments described herein should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Various terms used herein have special meanings within the present technical field. Whether a particular term should be construed as such a "term of art" depends on the context in which that term is used. "Connected to," "in communication with," "associated with," or other similar terms should generally be construed broadly to include situations both where communications and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Although the present application has been written describing a photomask and photolithography process in the context of certain line widths and photolithography imaging wavelengths, it is to be appreciated that the geometric principles and wavelength principles can be extrapolated by one of ordinary skill in the art to be applied to future (or past) generations of processing technologies. For instance, according to design needs and contexts, the dimensions described herein can be adjusted to be used with x-ray lithography, e-beam lithography, UV light lithography, extreme ultraviolet lithography, and ion projection lithography.

Further, it should be appreciated that "rectangular" with respect to the described patterns and formed shapes in the photoresist would also include squares, approximated rectangles having additional polygonal sides, and that a certain amount of non-linearity can be expected in an actual implementation. For example, there might be a 5% or 10% variation in the straightness of lines and/or there could be at least some chamfering or rounding of corners of the photomask or patterned holes in photoresist without detracting from the advantages described in the present application according to the effectiveness of the overall designs. In fact, according to design approaches it may even be desirable in certain implementations to deliberately provide for such features. All of these are to be covered as set forth in the claims herein.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method of fabricating a semiconductor device, the method comprising:
    providing a substrate having a photoresist layer;
    providing a mask having a substantially rectangular pattern and a pair of elongated patterns, each of the pair of elongated patterns having a first end and a second end opposite to the first end, wherein each of the pair of elongated patterns are shaped in such a way that a length of the elongated pattern from the first end to the second end is greater than a width of the elongated pattern, wherein the pair of elongated patterns are arranged in such a way that the first ends of both of the elongated patterns are connected to a first corner of the substantially rectangular pattern, wherein the pair of elongated patterns extend outwardly from the first corner of the substantially rectangular pattern; and
    forming a substantially rectangular shaped pattern on the photoresist layer resembling the substantially rectangular pattern of the mask using a cooperation of light exposure through the substantially rectangular pattern and the elongated pattern of the mask.

2. The method of fabricating the semiconductor device of claim 1, wherein the forming comprises applying an exposure process to the photoresist layer using the mask to:
    form a shaped pattern on the photoresist layer using the substantially rectangular pattern of the mask, and
    reduce a roundness of a corner of the shaped pattern on the photoresist layer using the elongated pattern.

3. The method of fabricating a semiconductor device of claim 2, wherein the exposure process comprises a quasar mode exposure of light.

4. The method of fabricating a semiconductor device of claim 1, wherein the mask further comprises other elongated patterns, each of the other elongated patterns proximate or connecting to and extending outwardly from each of the other corners of the substantially rectangular pattern of the mask, wherein the forming the substantially rectangular shaped pattern on the photoresist layer further comprises using light exposure through the other elongated patterns in cooperation with the substantially rectangular pattern and the elongated pattern of the mask.

5. The method of fabricating a semiconductor device of claim 4, wherein the mask further comprises a second set of other elongated patterns, each of the second set of other elongated patterns proximate or connecting to and extending outwardly from each of the corner and the other corners of the substantially rectangular pattern of the mask, wherein the forming the substantially rectangular shaped pattern on the photoresist layer further comprises using light exposure through the second set of other elongated patterns in cooperation with the substantially rectangular pattern of the mask, the elongated pattern, and the other elongated patterns.

6. The method of fabricating a semiconductor device of claim 5, wherein the elongated pattern and the elongated pattern of the second set of other elongated patterns extending outwardly from the corner are substantially orthogonal to each other.

7. The method of fabricating a semiconductor device of claim 1, wherein the mask further comprises a second substantially rectangular pattern and a corresponding elongated pattern, the corresponding elongated pattern proximate or connecting to and extending outwardly from a corner of the second substantially rectangular pattern of the mask;
    wherein the substantially rectangular pattern and the second substantially rectangular pattern of the mask are separated by a separation distance;
    wherein a length of the elongated member is greater than or equal to one quarter of the sum of a width of the substantially rectangular pattern and the separation distance; and
    wherein the method further comprises forming a second substantially rectangular shaped pattern on the photoresist layer resembling the second substantially rectangular pattern using a cooperation of light exposure through the second substantially rectangular pattern and the corresponding elongated pattern.

8. The method of fabricating a semiconductor device of claim 7, wherein the forming the second substantially rectangular shaped pattern on the photoresist layer comprises applying an exposure process to the photoresist layer using the mask to:
    form a second shaped pattern on the photoresist layer using light exposure through the second substantially rectangular pattern of the mask, and reduce a roundness of a corner of the second shaped pattern on the photoresist layer using light exposure through the corresponding elongated pattern of the mask.

9. The method of fabricating a semiconductor device of claim 1, wherein a width of the elongated pattern is less than or equal to 0.15 micrometers, the width of the elongated pattern being greater than a length of the elongated member.

10. The method of fabricating a semiconductor device of claim 1, further comprising etching the photoresist layer by removing a portion of the photoresist layer corresponding to the substantially rectangular shaped pattern.

11. The method of fabricating a semiconductor device of claim 1, further comprising etching the photoresist layer by removing a portion of the photoresist layer surrounding the substantially rectangular shaped pattern.

12. The method of fabricating a semiconductor device of claim 1, wherein:
the substantially rectangular pattern is a part of a series of substantially rectangular patterns and the elongated pattern is a part of a series of elongated patterns, each elongated pattern in the series of elongated patterns proximate or connecting to and extending outwardly from one of a plurality of corners of each substantially rectangular pattern in the series of substantially rectangular patterns, wherein each substantially rectangular pattern in the series of substantially rectangular patterns comprises a first width and a first length, wherein each elongated pattern in the series of elongated patterns comprises a second width and a second length greater than the second width, wherein each substantially rectangular pattern in the series of substantially rectangular patterns is separated from an adjacent substantially rectangular pattern by a separation distance, wherein the second length is greater than or equal to one quarter of the sum of the first width and the separation distance, and wherein the second width is less than or equal to 0.15 micrometers; and
the forming further comprises forming a series of substantially rectangular shaped patterns on the photoresist layer resembling the series of substantially rectangular patterns of the mask, each substantially rectangular shaped pattern in the series of substantially rectangular shaped patterns formed using a cooperation of light exposure through one substantially rectangular pattern from the series of substantially rectangular patterns and one or more elongated patterns from the series of elongated patterns.

13. The method of fabricating a semiconductor device of claim 12, wherein the forming further comprises applying an exposure process to the photoresist layer using the mask to:
form a series of shaped patterns on the photoresist layer, each shaped pattern in the series of shaped patterns formed using light exposure through one substantially rectangular pattern from the series of substantially rectangular patterns of the mask, and
reduce a roundness of one or more corners of each shaped pattern in the series of shaped patterns using light exposure through one or more elongated patterns from the series of elongated patterns of the mask.

14. The method of fabricating a semiconductor device of claim 13, wherein the exposure process comprises a quasar mode exposure of light.

15. The method of fabricating a semiconductor device of claim 12, further comprising etching the photoresist layer by removing a portion of the photoresist layer corresponding to the series of substantially rectangular shaped patterns.

16. The method of fabricating a semiconductor device of claim 12, further comprising etching the photoresist layer by removing a portion of the photoresist layer surrounding the series of substantially rectangular shaped patterns.

17. The method of fabricating a semiconductor device of claim 1, wherein the cooperation of light exposure through the substantially rectangular pattern and the elongated pattern of the mask is operable to improve the critical dimension uniformity (CDU) of the substantially rectangular shaped pattern formed on the photoresist layer.

18. A method of fabricating a mask for use in forming a substantially rectangular shaped pattern on a photoresist layer of a substrate, the method comprising:
providing a mask;
forming a substantially rectangular pattern on the mask; and
forming a pair of elongated patterns on the mask, each of the pair of elongated patterns having a first end and a second end opposite to the first end, wherein each of the pair of elongated patterns are shaped in such a way that a length of the elongated pattern from the first end to the second end is greater than the width of the elongated pattern, wherein the pair of elongated patterns are arranged in such a way that the first ends of both of the elongated patterns are connected to a first corner of the substantially rectangular pattern, wherein the pair of elongated patterns extend outwardly from the first corner of the substantially rectangular pattern;
wherein, when a photoresist layer of a substrate is applied to an exposure process using the mask, the mask is operable to form a substantially rectangular shaped pattern on the photoresist layer by forming a shaped pattern on the photoresist layer using light exposure through the substantially rectangular pattern of the mask and reducing a roundness of a corner of the shaped pattern using light exposure through the elongated pattern.

19. The method of fabricating a mask of claim 18, further comprising forming other elongated patterns, each of the other elongated patterns proximate or connecting to and extending outwardly from each of the other corners of the substantially rectangular pattern, wherein light exposure through the other elongated patterns are operable to cooperate with light exposure through the substantially rectangular pattern to reduce a roundness of other corners of the shaped pattern.

20. The method of fabricating a mask of claim 19, further comprising forming a second set of other elongated patterns, each of the second set of other elongated patterns proximate or connecting to and extending outwardly from each of the corner and the other corners of the substantially rectangular pattern, wherein light exposure through the second set of other elongated patterns is operable to cooperate with light exposure through the elongated pattern and the other elongated patterns to reduce the roundness of the corner and the other corners of the shaped pattern.

21. The method of fabricating a mask of claim 20, wherein the elongated pattern and the elongated pattern of the second set of other elongated patterns extending outwardly from the corner are substantially orthogonal to each other.

22. The method of fabricating a mask of claim 18, further comprising forming a second substantially rectangular pattern and a corresponding elongated pattern, the corresponding elongated pattern proximate or connecting to and extending outwardly from a corner of the second substantially rectangular pattern, wherein the substantially rectangular pattern and the second substantially rectangular pattern are separated by a separation distance, wherein a length of the elongated pattern is greater than or equal to one quarter of the sum of a width of the substantially rectangular pattern and the separation distance, wherein the mask is operable to form a second substantially rectangular shaped pattern on the photoresist layer resembling the second substantially rectangular pattern on the mask by forming a second shaped pattern on the photoresist layer using light exposure through the second substantially rectangular pattern of the mask and reducing a roundness of a corner of the second shaped pattern using light exposure through the corresponding elongated pattern.

23. The method of fabricating a mask of claim 18, wherein a width of the elongated pattern is less than or equal to 0.15 micrometers, the width of the elongated pattern being greater than a length of the elongated pattern.

24. The method of fabricating a mask of claim 18, wherein the exposure process comprises a quasar mode exposure of light.

25. The method of fabricating a mask of claim 18, wherein:
the substantially rectangular pattern is a part of a series of substantially rectangular patterns separated by a separation distance, each substantially rectangular pattern in the series having a first width and a first length;
the elongated pattern is a part of a series of elongated patterns, each elongated pattern in the series having a second width and a second length, each elongated pattern in the series proximate or connecting to and extending outwardly from one of a plurality of corners of each substantially rectangular pattern in the series of substantially rectangular patterns;
the second length is greater than or equal to one quarter of the sum of the first width and the separation distance, and the second width is less than or equal to 0.15 micrometers; and
when a photoresist layer of a substrate is applied to an exposure process using the mask, the mask is operable to form a series of substantially rectangular shaped patterns on the photoresist layer resembling the series of substantially rectangular patterns of the mask by forming a series of shaped patterns on the photoresist layer using light exposure through the series of substantially rectangular patterns formed on the mask and reducing a roundness of one or more corners of the series of shaped patterns on the photoresist layer using light exposure through the series of elongated patterns formed on the mask.

26. The method of fabricating a mask of claim 18, wherein the elongated pattern is operable to improve the critical dimension uniformity (CDU) of the substantially rectangular shaped pattern formed on the photoresist layer.

* * * * *